(12) United States Patent
Kung

(10) Patent No.: US 10,014,246 B2
(45) Date of Patent: Jul. 3, 2018

(54) CIRCUIT SUBSTRATE, SEMICONDUCTOR PACKAGE AND PROCESS FOR FABRICATING THE SAME

(71) Applicant: VIA Technologies, Inc., New Taipei (TW)

(72) Inventor: Chen-Yueh Kung, New Taipei (TW)

(73) Assignee: VIA Technologies, Inc., New Taipei (TW)

( * ) Notice: Subject to any disclaimer, the term of this patent is extended or adjusted under 35 U.S.C. 154(b) by 0 days.

(21) Appl. No.: 15/284,514

(22) Filed: Oct. 3, 2016

(65) Prior Publication Data

US 2017/0025343 A1 Jan. 26, 2017

Related U.S. Application Data

(62) Division of application No. 13/898,486, filed on May 21, 2013, now Pat. No. 9,497,864.

(30) Foreign Application Priority Data

Mar. 26, 2013 (TW) .............................. 102110702 A

(51) Int. Cl.
*H05K 1/11* (2006.01)
*H05K 1/18* (2006.01)
(Continued)

(52) U.S. Cl.
CPC ...... *H01L 23/49838* (2013.01); *H01L 21/486* (2013.01); *H01L 21/4853* (2013.01); *H01L 21/4857* (2013.01); *H01L 21/4882* (2013.01);
*H01L 21/563* (2013.01); *H01L 23/13* (2013.01); *H01L 23/3185* (2013.01);
(Continued)

(58) Field of Classification Search
CPC .... H01L 24/50; H05K 1/0277; H05K 1/0278; H05K 1/028; H05K 1/0281; H05K 1/0283; H05K 1/0393; H05K 1/118; H05K 1/147; H05K 1/148; H05K 1/189; H05K 2201/042; H05K 2201/046; H05K 2201/05
See application file for complete search history.

(56) References Cited

U.S. PATENT DOCUMENTS

2008/0308308 A1* 12/2008 Kobayashi .......... H01L 21/4853
174/257
2009/0188806 A1* 7/2009 Yamasaki .............. H05K 3/108
205/122

(Continued)

*Primary Examiner* — Ishwarbhai B Patel
(74) *Attorney, Agent, or Firm* — JCIPRNET

(57) ABSTRACT

A circuit substrate has the following elements. A stacked circuit structure has a first surface and a second surface opposite thereto surface. A first patterned inner conductive layer is disposed on the first surface and has multiple pads. A first patterned outer conductive layer is disposed on the patterned inner conductive layer and has multiple conductive pillars, wherein each of the first conductive pillar is located on the corresponding first pad. The first dielectric layer covers the first surface, the first patterned inner conductive layer and the first patterned outer conductive layer, and has multiple first concaves, wherein the first concave exposes the top and side of the corresponding first conductive pillar. A semiconductor package structure applied the above circuit substrate and a process for fabricating the same are also provided here.

11 Claims, 14 Drawing Sheets

(51) Int. Cl.

| | |
|---|---|
| *H01L 23/498* | (2006.01) |
| *H05K 3/00* | (2006.01) |
| *H05K 3/40* | (2006.01) |
| *H01L 23/13* | (2006.01) |
| *H01L 23/367* | (2006.01) |
| *H01L 21/48* | (2006.01) |
| *H01L 21/56* | (2006.01) |
| *H01L 23/31* | (2006.01) |
| *H01L 23/00* | (2006.01) |
| *H05K 3/28* | (2006.01) |

(52) U.S. Cl.
CPC ...... *H01L 23/3675* (2013.01); *H01L 23/3677* (2013.01); *H01L 23/49811* (2013.01); *H01L 23/49822* (2013.01); *H01L 23/49827* (2013.01); *H01L 24/16* (2013.01); *H05K 1/112* (2013.01); *H05K 1/181* (2013.01); *H05K 3/0026* (2013.01); *H05K 3/4007* (2013.01); *H01L 2224/10* (2013.01); *H01L 2224/16157* (2013.01); *H01L 2224/73204* (2013.01); *H05K 1/119* (2013.01); *H05K 3/28* (2013.01); *H05K 2201/09472* (2013.01); *H05K 2201/10378* (2013.01); *H05K 2201/10674* (2013.01); *H05K 2201/10734* (2013.01); *H05K 2203/0723* (2013.01); *H05K 2203/107* (2013.01); *H05K 2203/1476* (2013.01); *Y10T 29/49156* (2015.01)

(56) References Cited

U.S. PATENT DOCUMENTS

2012/0067635 A1\* 3/2012 Nang ................... B23K 1/0016
  174/260
2013/0180772 A1\* 7/2013 Inoue ..................... H05K 1/111
  174/263

\* cited by examiner

CIRCUIT SUBSTRATE, SEMICONDUCTOR PACKAGE AND PROCESS FOR FABRICATING THE SAME

CROSS-REFERENCE TO RELATED APPLICATION

This application is a divisional application of and claims the priority benefit of a prior application Ser. No. 13/898,486, now U.S. Pat. No. 9,497,864, filed on May 21, 2013, which claims the priority benefit of Taiwan application serial no. 102110702, filed on Mar. 26, 2013. The entirety of each of the above-mentioned patent applications is hereby incorporated by reference herein and made a part of this specification.

FIELD OF THE INVENTION

The present invention relates to a circuit substrate, a semiconductor package, and a process for fabricating the same employed in semiconductor packaging technology field.

DESCRIPTION OF RELATED ART

In current technology of semiconductor packaging, a chip carrier is used for connecting a semiconductor integrated circuit chip (IC chip) with an electronic component of the next level such as mother board, module board, or the like. The circuit substrate is usually applied to a chip carrier of high contact count. A circuit substrate is mainly composed of a plurality of patterned conductive layers and a plurality of dielectric layers alternately stacked to one another. In addition, two patterned conductive layers can be electrically connected through a conductive via.

Flip-chip bonding is applied in chip packaging technology of high contact count, and an IC chip can be connected to the circuit substrate through a plurality of pads which are arranged in area array. In order to connect with the bumps used for flip-chip bonding, the pad area of the circuit substrate should be large enough, so as to ensure that the bonding area between the bump and the corresponding pad is large enough to achieve the required bonding strength. However, owing to the large pad area, the layout density of the circuit substrate is not able to be further enhanced.

SUMMARY OF THE INVENTION

The present invention is directed to a circuit substrate adapted to be applied to semiconductor packing technology.

The present invention is directed to a semiconductor package adapted to be applied to packaging semiconductor IC chip.

A circuit substrate of the present invention includes the following components. A stacked circuit structure has a first surface and a second surface opposite to the first surface. A first patterned inner conductive layer is disposed on the first surface and has a plurality of first pads. A first patterned outer conductive layer is disposed on the first patterned inner conductive layer and has a plurality of first conductive pillars, wherein each of the first conductive pillars is located on the corresponding first pad. A first dielectric layer covers the first surface, the first patterned inner conductive layer and the first patterned outer conductive layer and has a plurality of first concaves, wherein each of the first concaves exposes a top and a side of the corresponding first conductive pillar, and the top and the side of the first conductive pillar are exposed for directly soldering a chip. A second patterned inner conductive layer is disposed on the second surface and having a plurality of second pads. A second patterned outer conductive layer is disposed on the second patterned inner conductive layer and has a plurality of second conductive pillars, wherein each of the second conductive pillars is located on the corresponding second pad. A second dielectric layer covers the second surface, the second patterned inner conductive layer and the second patterned outer conductive layer and has a plurality of second concaves, wherein each of the second concaves exposes a top and a side of the corresponding second conductive pillar. An outer diameter of each of the second conductive pillars is smaller than an outer diameter of the corresponding second pad, and the corresponding second concave exposes a portion of the corresponding second pad.

A semiconductor package of the present invention includes a circuit substrate and a chip. The circuit substrate includes the following components. A stacked circuit structure has a first surface and a second surface opposite to the first surface. A first patterned inner conductive layer is disposed on the first surface and has a plurality of first pads. A first patterned outer conductive layer is disposed on the first patterned inner conductive layer and has a plurality of first conductive pillars, wherein each of the first conductive pillars is located on the corresponding first pad. A first dielectric layer covers the first surface, the first patterned inner conductive layer and the first patterned outer conductive layer and has a plurality of first concaves, wherein each of the first concaves exposes a top and a side of the corresponding first conductive pillar. A second patterned inner conductive layer is disposed on the second surface and has a plurality of second pads. A second patterned outer conductive layer is disposed on the second patterned inner conductive layer and has a plurality of second conductive pillars, wherein each of the second conductive pillars is located on the corresponding second pad. A second dielectric layer covers the second surface, the second patterned inner conductive layer and the second patterned outer conductive layer and has a plurality of second concaves, wherein each of the second concaves exposes a top and a side of the corresponding second conductive pillar. An outer diameter of each of the second conductive pillars is smaller than an outer diameter of the corresponding second pad, and the corresponding second concave exposes a portion of the corresponding second pad. A chip is soldered to the first conductive pillars.

In light of the above, in the present invention, since in order to provide a larger three dimensional bonding area out of the smaller two dimensional pad area, the top and side of the conductive pillars located on the pads are exposed through the concaves of the dielectric layers, this facilitates the increase of the gaps between the pads and the increase of layout density.

To make the above features and advantages of the present invention more comprehensible, several embodiments accompanied with drawings are described in detail as follows.

DESCRIPTION OF EMBODIMENTS

Figure 1A:
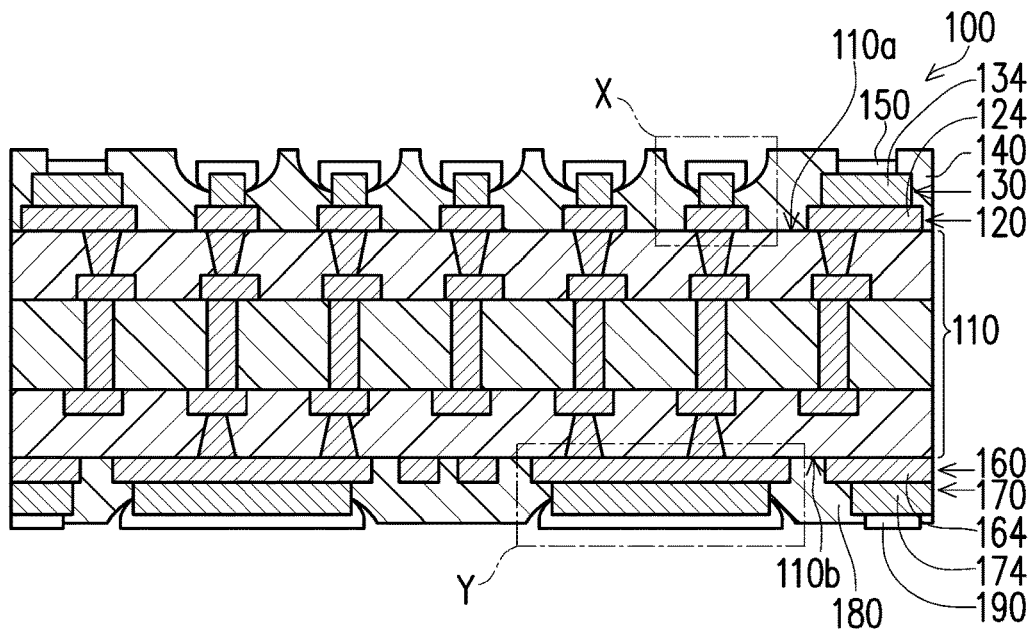
FIG. 1A is a partial cross-sectional view of a circuit substrate according to an embodiment of the present invention.

FIG. 1A is a partial cross-sectional view of a circuit substrate according to an embodiment of the present invention. Referring to FIG. 1A, the circuit substrate 100 of the embodiment includes a stacked circuit structure 110 having a first surface 110a and a second surface 110b opposite to the first surface 110a. In the present embodiment, the stacked circuit structure 110 is composed of a plurality of patterned conductive layers and one or more dielectric layers alternately stacked to one another. In addition, the patterned conductive layers can be electrically connected through conductive vias. Nevertheless, the present invention should not be construed as limited to the embodiments set forth herein. In other embodiments not shown in the drawings, the stacked circuit structure 110 can also be composed of any other quantities of patterned conductive layers and dielectric layers alternately stacked to one another. In another embodiment not shown in the drawings, the stacked circuit structure 110 can also be composed of only a single dielectric layer.

Figure 1B:
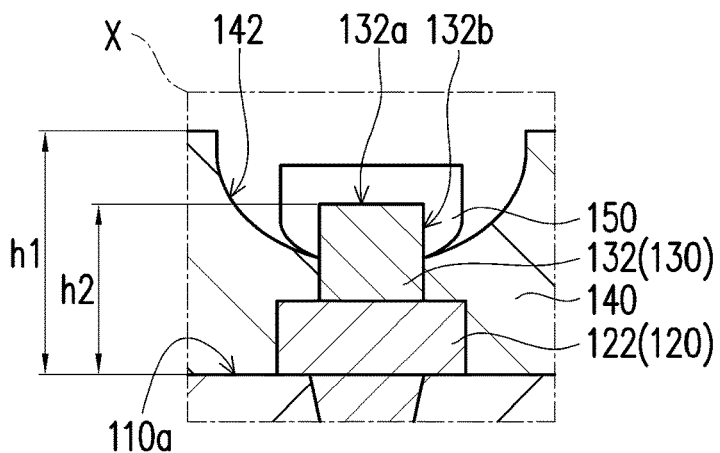
FIG. 1B is an enlarged view of the X portion of FIG. 1A.
Figure 1C:
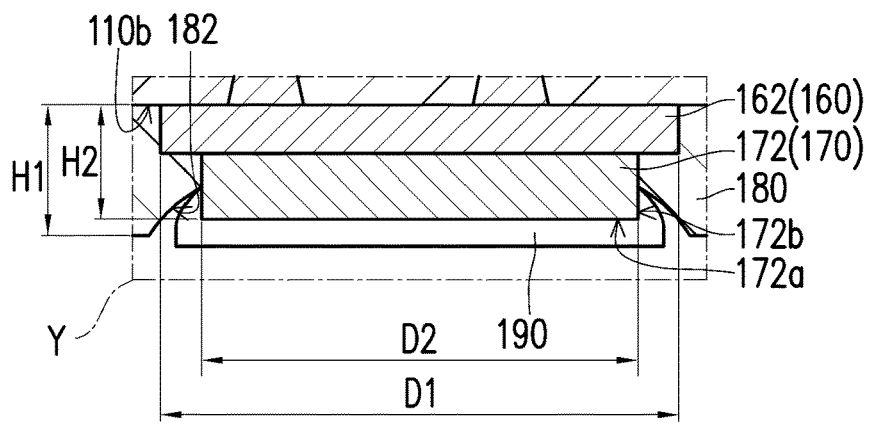
FIG. 1C is an enlarged view of the Y portion of FIG. 1A.
Figure 2:
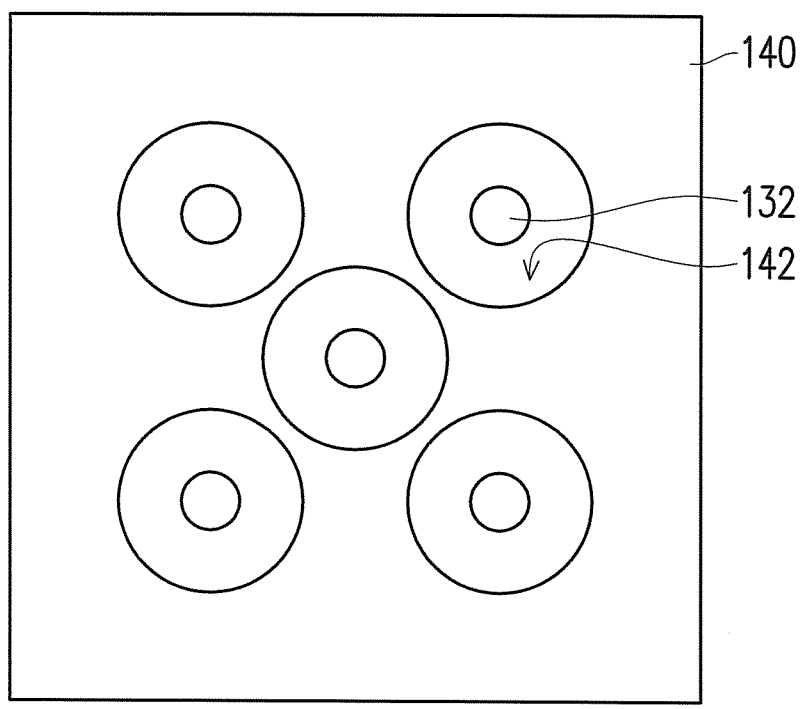
FIG. 2 is a partial top view illustrating the circuit substrate of FIG. 1A.

FIG. 1B is an enlarged view of the X portion of FIG. 1A. FIG. 1C is an enlarged view of the Y portion of FIG. 1A. FIG. 2 is a partial top view illustrating the circuit substrate of FIG. 1A Referring to FIG. 1A, FIG. 1B, FIG. 1C and FIG. 2, the circuit substrate 100 further includes a first patterned inner conductive layer 120, a first patterned outer conductive layer 130 and a first dielectric layer 140. The first patterned inner conductive layer 120 is disposed on the first surface 110a and has a plurality of first pads 122. The first patterned outer conductive layer 130 is disposed on the first patterned inner conductive layer 120 and has a plurality of first conductive pillars 132, wherein each of the first conductive pillars 132 is located on the corresponding first pad 122. The first dielectric layer 140 covers the first surface 110a, the first patterned inner conductive layer 120 and the first patterned outer conductive layer 130, and the first dielectric layer 140 has a plurality of first concaves 142 as shown in FIG. 2, wherein each of the first concaves 142 exposes a top 132a and a side 132b of the corresponding first conductive pillar 132. In the present embodiment, the first concave 142 exposes a portion of the side 132b of the corresponding first conductive pillar 132. However, in other embodiments, the exposed area of the side 132b can be changed as required.

It should be noted that the height h1 of the first dielectric layer 140 relative to the first surface 110a is greater than the height h2 of the first conductive pillars 132 relative to the first surface 110a, wherein the height h1 is the highest height relative to the first surface 110a, for example. In addition, the circuit substrate 100 further includes a plurality of first protective layers 150 respectively cover portions of the first patterned outer conductive layers 130 exposed by the first dielectric layer 140, for example, the top 132a and the side 132b of each of the first conductive pillars 132 exposed by the first dielectric layer 140.

Referring to FIG. 1A, FIG. 1B and FIG. 1C, the circuit substrate 100 further includes a second patterned inner conductive layer 160, a second patterned outer conductive layer 170 and a second dielectric layer 180. The second patterned inner conductive layer 160 is disposed on the second surface 110b and has a plurality of second pads 162. The second patterned outer conductive layer 170 is disposed on the second patterned inner conductive layer 160 and has a plurality of second conductive pillars 172, wherein each of the second conductive pillars 172 is located on the corresponding second pad 162. The second dielectric layer 180 covers the second surface 110b, the second patterned inner conductive layer 160 and the second patterned outer conductive layer 170, and the second dielectric layer 180 has a plurality of second concaves 182, wherein each of the second concaves 182 exposes a top 172a and a side 172b of the corresponding second conductive pillar 172. In the present embodiment, the second concave 182 exposes a portion of the side 172b of the corresponding second conductive pillar 172. However, in other embodiments, the exposed area of the side 172b can be changed as required. Besides, the thickness of the second patterned outer conductive layer 170 and the thickness of the first patterned outer conductive layer 130 are substantially the same.

It should be noted that the height H1 of the second dielectric layer 180 relative to the second surface 110b is greater than the height H2 of the second conductive pillars 172 relative to the second surface 110b, wherein the height H1 is the highest height relative to the second surface 110b, for example. Additionally, the circuit substrate 100 further includes a plurality of second protective layers 190 respectively cover portions of the second patterned outer conductive layers 170 exposed by the second dielectric layer 180, for example, the top 172a and the side 172b of each of the second conductive pillars 172 exposed by the second dielectric layer 180. Furthermore, In the present embodiment, the outer diameter D2 of the second conductive pillar 172 is smaller than the outer diameter D1 of the corresponding second pad 162. Moreover, in another embodiment, under the condition of the outer diameter D2 of the second conductive pillar 172 smaller than the outer diameter D1 of the corresponding second pad 162, the second concave 182 further exposes a portion of the corresponding second pad 162, such as a portion of the top and even a portion of the side of the second pad 162 (not shown).

Figure 3:
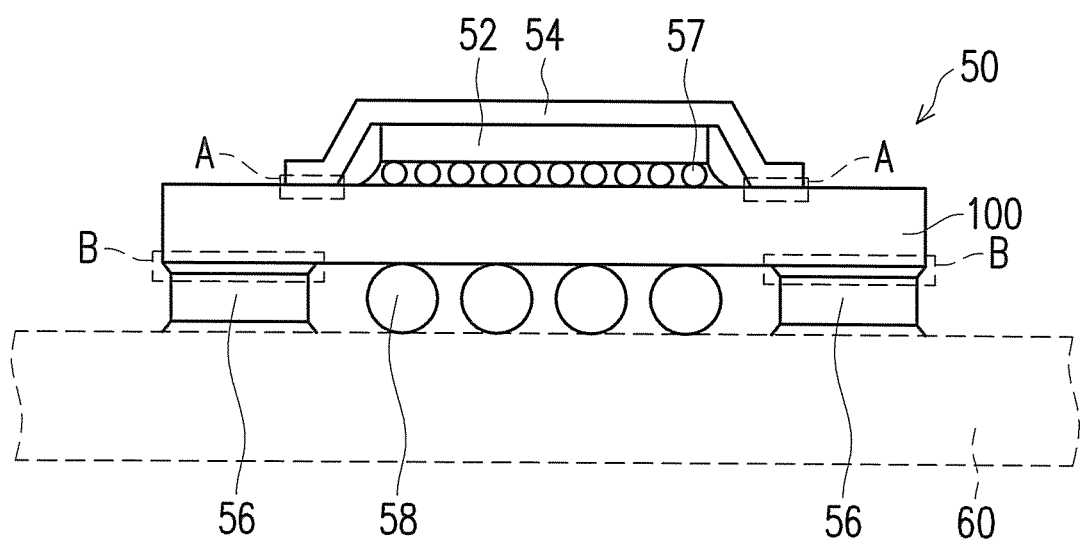
FIG. 3 illustrates the circuit substrate of FIG. 1A applied to a semiconductor package.

FIG. 3 illustrates the circuit substrate of FIG. 1A applied to a semiconductor package. Referring to FIG. 1A, FIG. 1B, FIG. 1C and FIG. 3, the circuit substrate 100 of FIG. 1A is adapted to be applied to the semiconductor package 50, so that the chip 52 can be soldered to the first conductive pillars 132 of the circuit substrate 100. Specifically, the chip 52 can be connected onto the first conductive pillars 132 of the circuit substrate 100 through a plurality of solder bumps 57, and the filling of encapsulant can protect the solder bumps 57. In addition, the circuit substrate 100 can further soldered to the circuit board 60 through the solder balls 58.

The first patterned inner conductive layer 120 has at least one first inner conductive pattern 124. The first patterned outer conductive layer 130 has at least one first outer conductive pattern 134. The first outer conductive pattern 134 is located on the first inner conductive pattern 124, and the first dielectric layer 140 exposes a portion of the first outer conductive pattern 134 so as to thermally connected with the heat dissipating element, for example the heat spreader 54 of FIG. 3. The heat spreader 54 dissipates heat through the area A shown in FIG. 3. In addition to serving as a heat dissipating path, the first inner conductive pattern 124 and the first outer conductive pattern 134 can also serve as a reference plane, for example a ground plane or a power plane. It has to be described that, the quantities of the abovementioned first inner conductive pattern 124 and the first outer conductive pattern 134 are not limited to be one, and the quantities can be changed according to different requirements.

The second patterned inner conductive layer 160 has at least one second inner conductive pattern 164. The second patterned outer conductive layer 170 has at least one second outer conductive pattern 174. The second outer conductive pattern 174 is located on the second inner conductive pattern 164, and the second dielectric layer 180 exposes a portion of the second outer conductive pattern 174 so as to thermally connected with the heat dissipating element, for example the heat slug 56 of FIG. 3. The heat slug 56 dissipates heat through the area B shown in FIG. 3. In addition to serving as a heat dissipating path, the second inner conductive pattern 164 and the second outer conductive pattern 174 can also serve as a reference plane, for example a ground plane or a power plane. It has to be described that, the quantities of the abovementioned second inner conductive pattern 164 and the second outer conductive pattern 174 are not limited to be one, and the quantities can be changed according to different requirements.

Figure 4A:
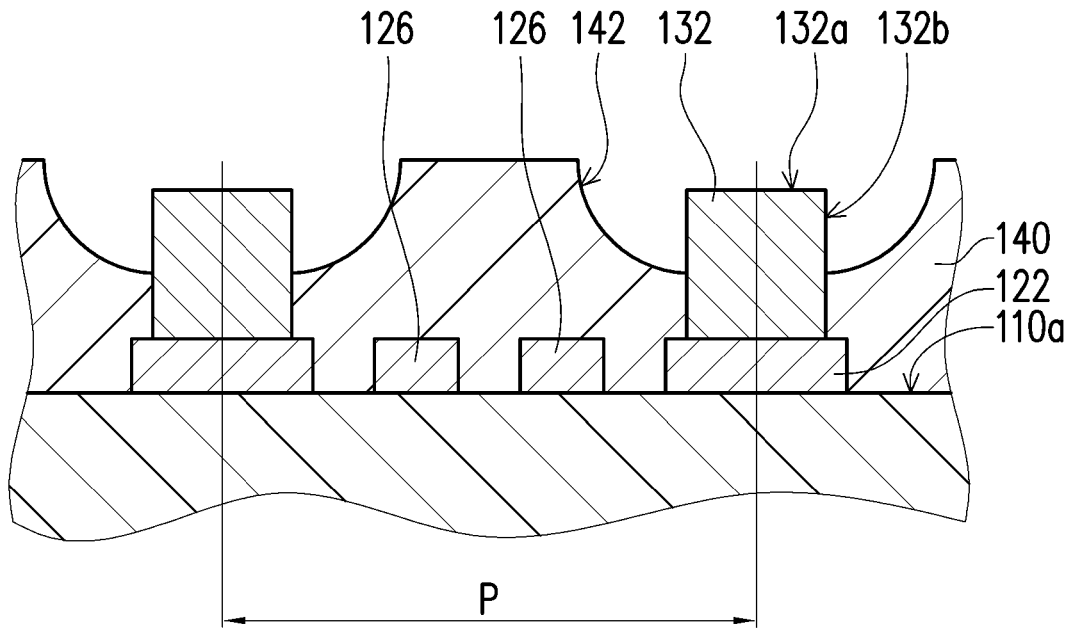
FIG. 4A and FIG. 4B are partial enlarged cross-sectional views of the circuit substrate of FIG. 1A and a conventional circuit substrate.
Figure 4B:
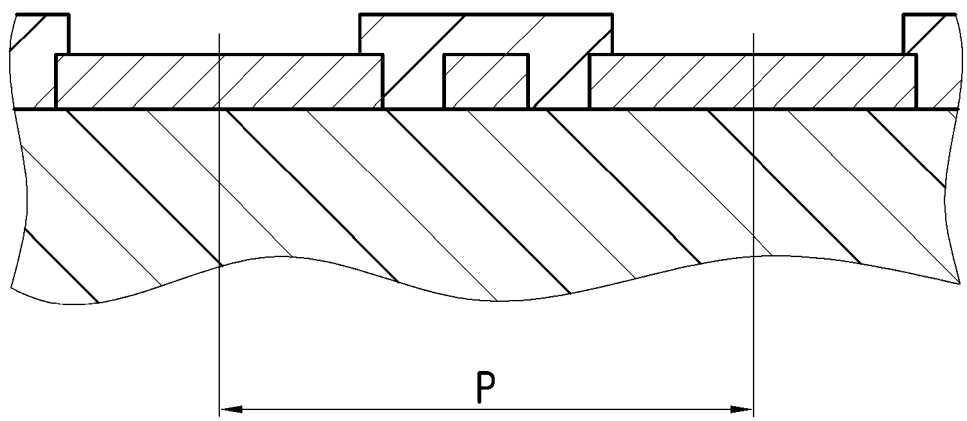

FIG. 4A and FIG. 4B are partial enlarged cross-sectional views of the circuit substrate of FIG. 1A and a conventional circuit substrate. FIG. 4A is a partial enlarged cross-sectional view of the circuit substrate of FIG. 1A and FIG. 4B is a partial enlarged cross-sectional view of a conventional circuit substrate. Referring to FIG. 4A and FIG. 4B, under the condition of having the same distance P, the first conductive pillars 132 are disposed on the first pads 122 in the present embedment, and the first conductive pillars 132 are exposed by the first concaves 142 of the first dielectric layer 140 for providing a larger bonding area. Therefore, the outer diameter of each of the first pads 122 is designed to be smaller, so that more traces 126 can be accommodated between the adjacent first pads 122.

Figure 5:
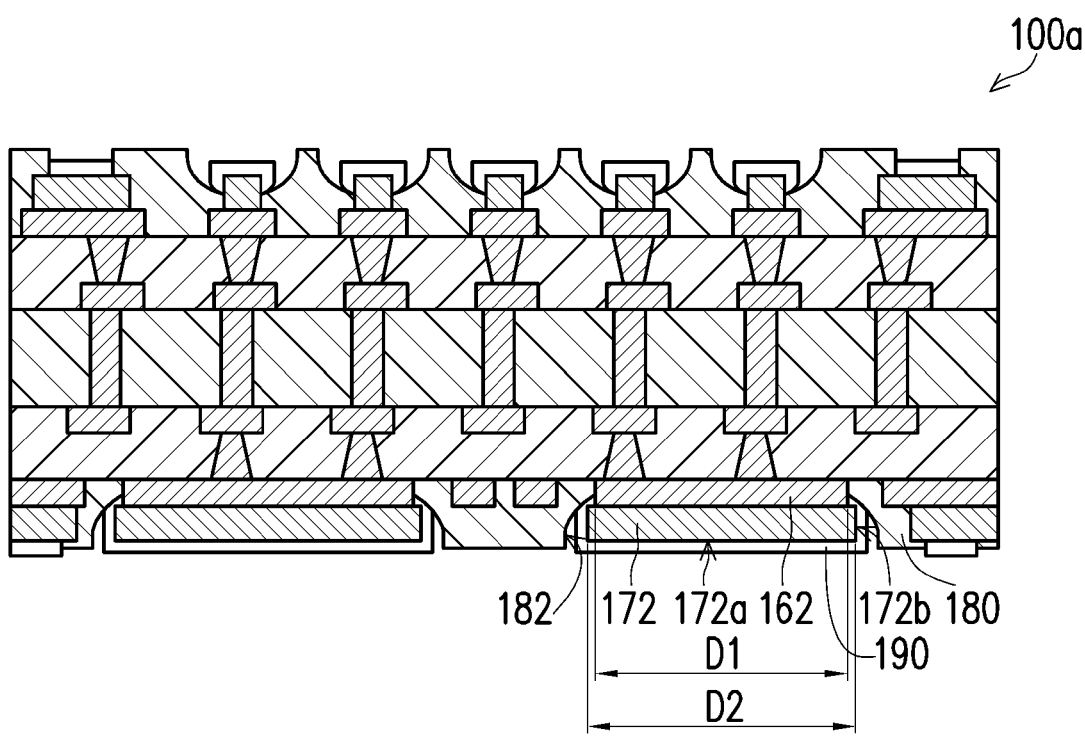
FIG. 5 is a partial cross-sectional view of a circuit substrate according to another embodiment of the present invention.

FIG. 5 is a partial cross-sectional view of a circuit substrate according to another embodiment of the present invention. Referring to FIG. 5, the circuit substrate 100a has a similar structure to the circuit substrate 100 of FIG. 1A. Different than the circuit substrate 100 of FIG. 1A, in the circuit substrate 100a of FIG. 5, the outer diameter D2 of the second conductive pillar 172 is greater than the outer diameter D1 of the corresponding second pad 162. Therefore, the second concaves 182 expose a portion of the corresponding second pad 162, such as the side of the second pad 162. In the embodiment, the second protective layer 190 further covers the side of the second pad 162, the top 172a and the side 172b of each of the second conductive pillars 172 which are exposed by the second dielectric layer 180.

Figure 6:
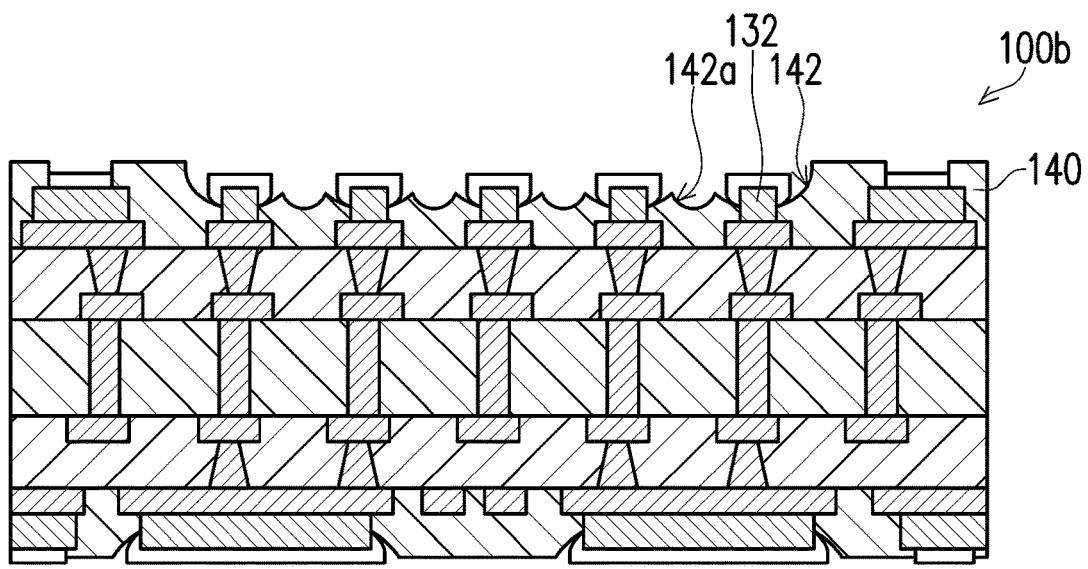
FIG. 6 is a partial cross-sectional view of a circuit substrate according to another embodiment of the present invention.
Figure 7:
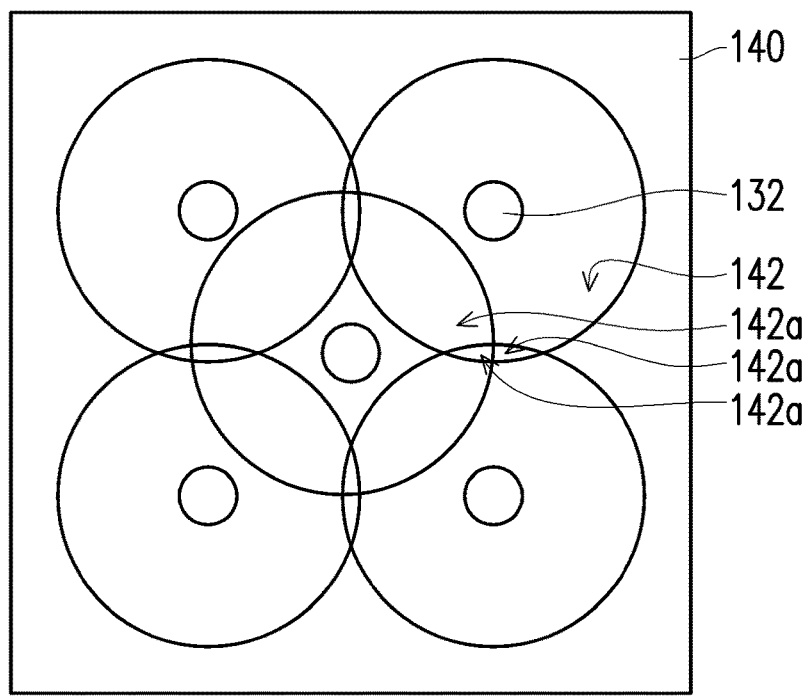
FIG. 7 is a partial top view illustrating the circuit substrate of FIG. 6.

FIG. 6 is a partial cross-sectional view of a circuit substrate according to another embodiment of the present invention. FIG. 7 is a partial top view of the circuit substrate of FIG. 6. Referring to FIG. 6 and FIG. 7, the circuit substrate 100b of FIG. 6 has a similar structure to the circuit substrate 100 of FIG. 1A. Different than the first concaves 142 of the circuit substrate 100 of FIG. 2 being independent, in the circuit substrate 100b of FIG. 6, the adjacent first concaves 142 overlap one another and a sub-concave 142a is formed therebetween. Even some of the sub-concaves 142a are formed by the overlapping of three first concaves 142.

Figure 8A:
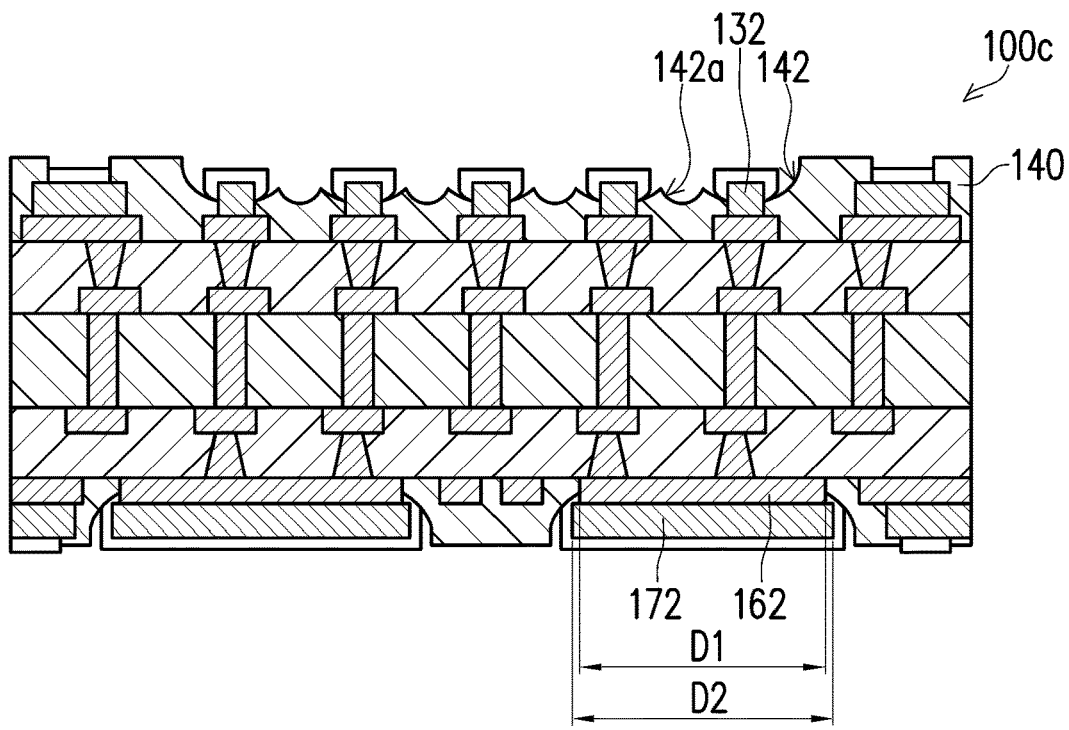
FIG. 8A is a partial cross-sectional view of a circuit substrate according to another embodiment of the present invention.

FIG. 8A is a partial cross-sectional view of a circuit substrate according to another embodiment of the present invention. Referring FIG. 8A, the circuit substrate 100c has the feature of the outer diameter D2 of each of the second conductive pillars 172 being greater than the outer diameter D1 of the corresponding second pad 162, and further has the feature of a sub-concave 142a being formed between the adjacent first concaves 142 due to the overlapping thereof.

Figure 8B:
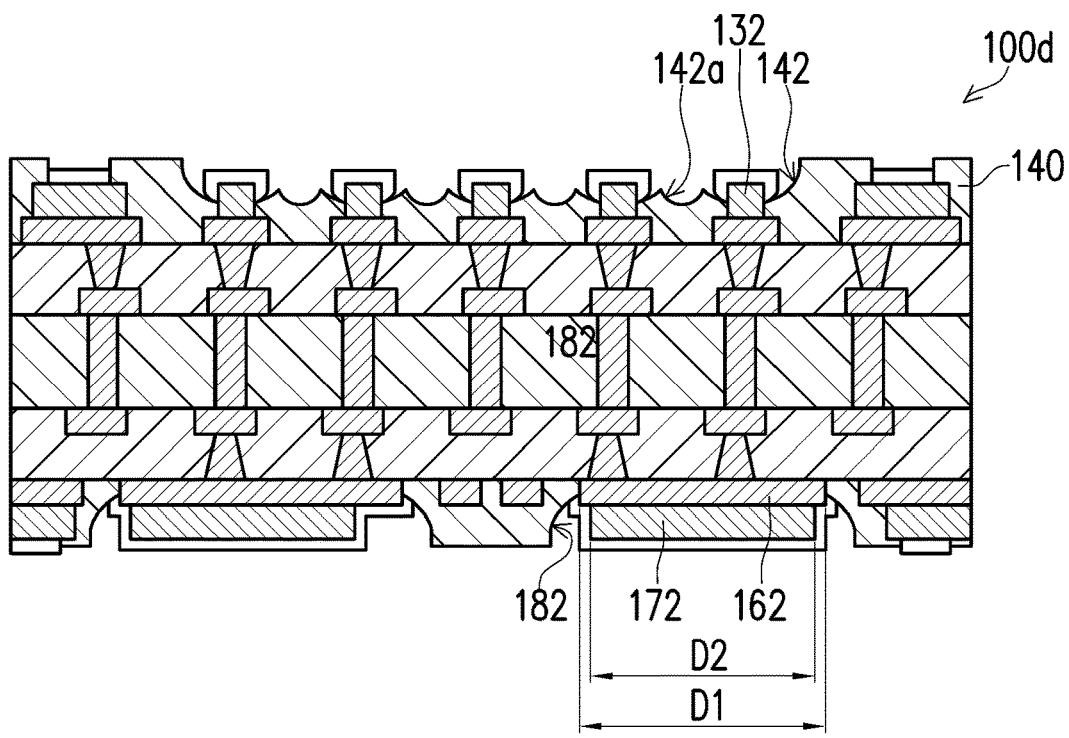
FIG. 8B is a partial cross-sectional view of a circuit substrate according to another embodiment of the present invention.

FIG. 8B is a partial cross-sectional view of a circuit substrate according to another embodiment of the present invention. Referring FIG. 8B, the circuit substrate 100d has the feature of the outer diameter D2 of each of the second conductive pillars 172 being smaller than the outer diameter D1 of the corresponding second pad 162, the second concaves 182 exposing a portion of the corresponding second pad 162, and further has the feature of a sub-concave 142a being formed between the adjacent first concaves 142 due to the overlapping thereof.

Figure 9A:
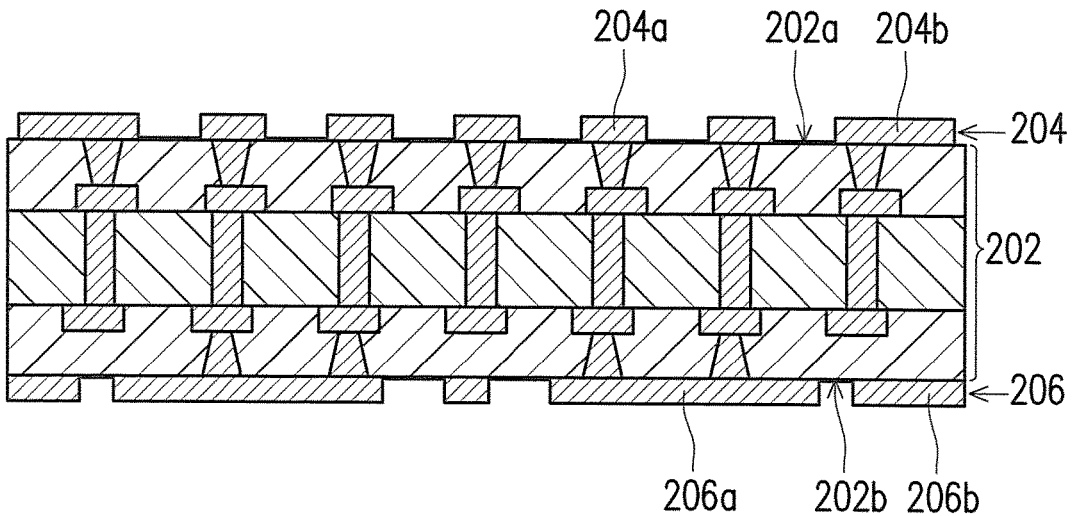
FIG. 9A through FIG. 9G are cross-sectional views illustrating a process of fabricating a circuit substrate according to an embodiment of the present invention.

FIG. 9A through FIG. 9G are cross-sectional views illustrating a process of fabricating a circuit substrate according to an embodiment of the present invention. Referring to FIG. 9A, first, a stacked circuit structure 202, a first patterned inner conductive layer 204 and a second patterned inner conductive layer 206 are provided. The stacked circuit structure 202 has a first surface 202a and a second surface 202b opposite to the first surface 202a. The first patterned inner conductive layer 204 is disposed on the first surface 202a and has a plurality of first pads 204a and at least one first inner conductive pattern 204b. The second patterned inner conductive layer 206 is disposed on the second surface 202a and has a plurality of second pads 206a and at least one second inner conductive pattern 206b. Similar to the stacked circuit structure 110 of FIG. 1A, the stacked circuit structure 202 herein can be composed of different numbers of patterned conductive layers and dielectric layers alternately stacked to one another, and the patterned conductive layers are electrically connected through conductive vias, or the stacked circuit structure 202 can be composed of a single dielectric layer. In one embodiment, the thickness of the first patterned inner conductive layer 204 is smaller than the thickness of the patterned conductive layer of the stacked circuit structure 202. In another embodiment, the thickness of the second patterned inner conductive layer 206 is smaller than the thickness of the patterned conductive layer of the stacked circuit structure 202.

Figure 9B:
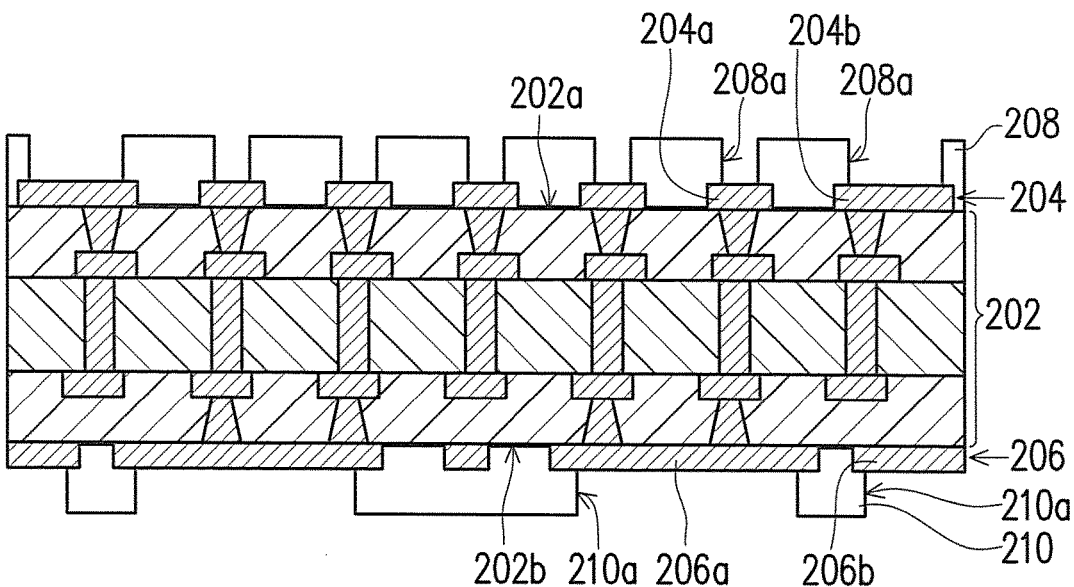

Referring to FIG. 9B, a first patterned photoresist layer 208 is formed on the first surface 202a of the stacked circuit structure 202 and a portion of the first patterned inner conductive layer 204 is covered. The first patterned photoresist layer 208 can be composed of one or more patterned photoresist layers. The first patterned photoresist layer 208 exposes a portion of the first pads 204a and the first inner conductive pattern 204b. Specifically, the first patterned photoresist layer 208 having a plurality of photoresist openings 208a covers the side and a portion of the top of each of the first pads 204a and the side and a portion of the top of the first inner conductive pattern 204b, and respectively exposes a portion of the top of each of the first pads 204a and a portion of the top of the first inner conductive pattern 204b through the first photoresist openings 208a.

Referring to FIG. 9B, a second patterned photoresist layer 210 is formed on the second surface 202b of the stacked circuit structure 202 and a portion of the second patterned inner conductive layer 206 is covered. The second patterned photoresist layer 210 can be composed of one or more patterned photoresist layers. The second patterned photoresist layer 210 exposes a portion of the second pads 206a and the second inner conductive pattern 206b. Specifically, the second patterned photoresist layer 210 having a plurality of photoresist openings 210a covers the side and a portion of the top of each of the second pads 206a and the side and a portion of the top of the second inner conductive pattern 206b, and respectively exposes a portion of the top of each of the second pads 206a and a portion of the top of the second inner conductive pattern 206b through the second photoresist openings 210a.

Figure 9C:
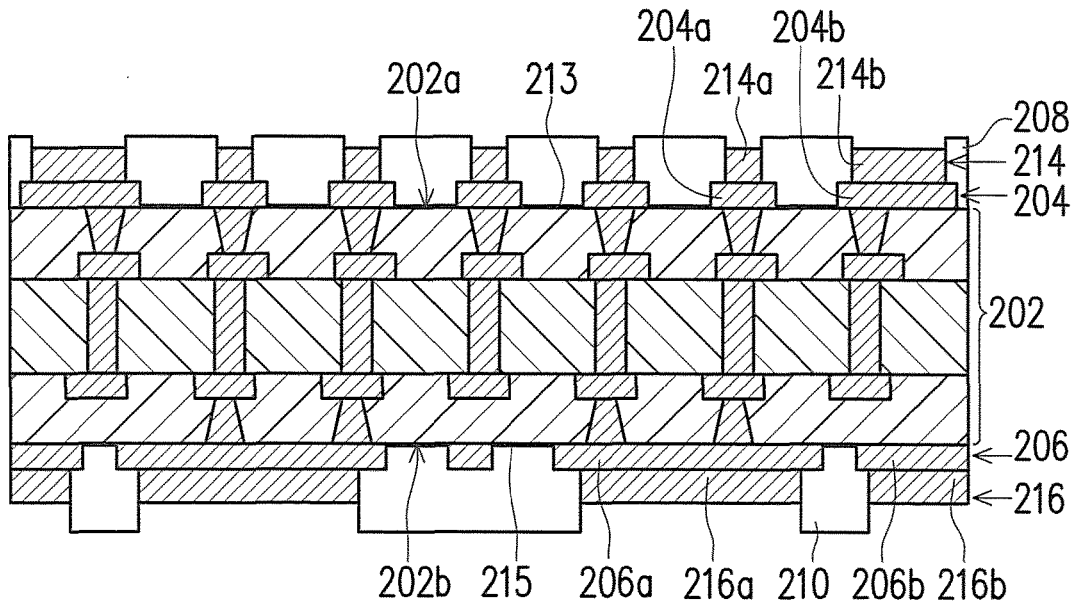

Referring to FIG. 9C, a first patterned outer conductive layer 214 is formed on the first patterned inner conductive layer 204 exposed by the first patterned photoresist layer 208 through a first seed layer 213 by using an electroplating method. In one embodiment, before the first patterned photoresist layer 208 is formed, the first seed layer 213 can firstly be formed at the position of the first patterned inner conductive layer 204 and the first surface 202a of the exposed stacked circuit structure 202. The first seed layer 213 can be a conductive layer. The first patterned outer conductive layer 214 has a plurality of first conductive pillars 214a and at least one first outer conductive pattern 214b. The first conductive pillars 214a are located on the corresponding first pads 204a, and the first outer conductive pattern 214b is located on the first inner conductive pattern 204b. In one embodiment, the thickness of the first seed layer 213 is smaller than the thickness of the patterned conductive layer of the stacked circuit structure 202.

Referring to FIG. 9C, a second patterned outer conductive layer 216 is formed on the second patterned inner conductive layer 206 exposed by the second patterned photoresist layer 210 through a second seed layer 215 by using an electroplating method. In one embodiment, before the second patterned photoresist layer 210 is formed, the second seed layer 215 can firstly be formed at the position of the second patterned inner conductive layer 206 and the second surface 202b of the exposed stacked circuit structure 202. The second seed layer 215 can be a conductive layer. The second patterned outer conductive layer 216 has a plurality of second conductive pillars 216a and at least one second outer conductive pattern 216b. The second conductive pillars 216a are located on the corresponding second pads 206a, and the second outer conductive pattern 216b is located on the second inner conductive pattern 206b. In one embodiment, the thickness of the second seed layer 215 is smaller than the thickness of the patterned conductive layer of the stacked circuit structure 202. In another embodiment, the thickness of the second patterned outer conductive layer 216 and the thickness of the first patterned outer conductive layer 214 are substantially the same.

Figure 9D:
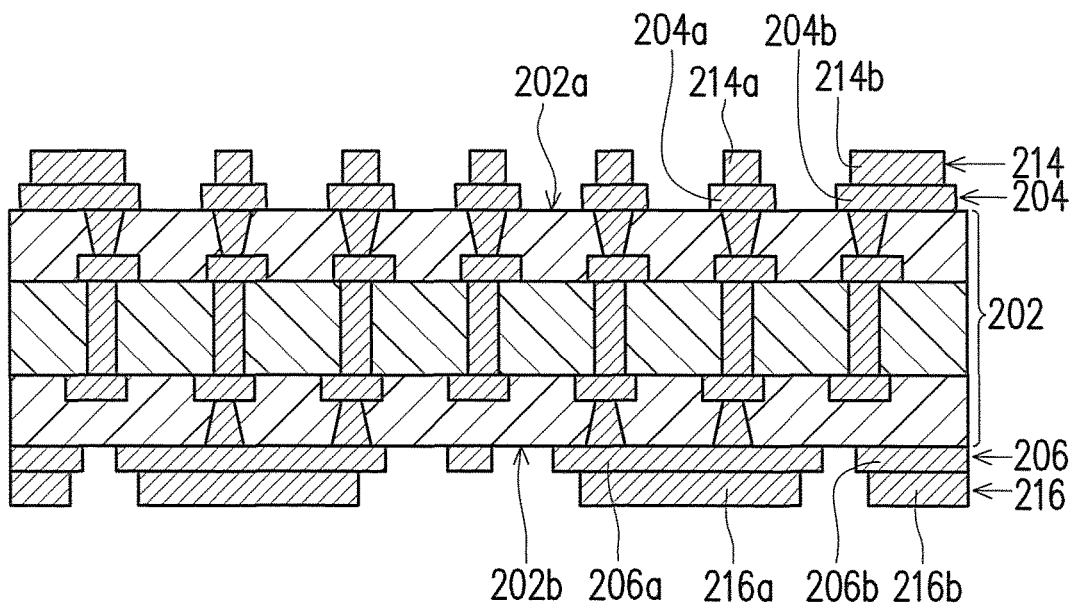

Referring to FIG. 9D, after the first patterned outer conductive layer 214 and the second patterned outer conductive layer 216 are formed, the first patterned photoresist layer 208, the second patterned photoresist layer 210, the exposed first seed layer 213 and the exposed second seed layer 215 are removed. In the present embodiment, though it is disclosed that the patterned photoresist layer is used as a mask and electroplating method is used to form the first patterned outer conductive layer 214 and the second patterned outer conductive layer 216, the present invention is not limited thereto.

Figure 9E:
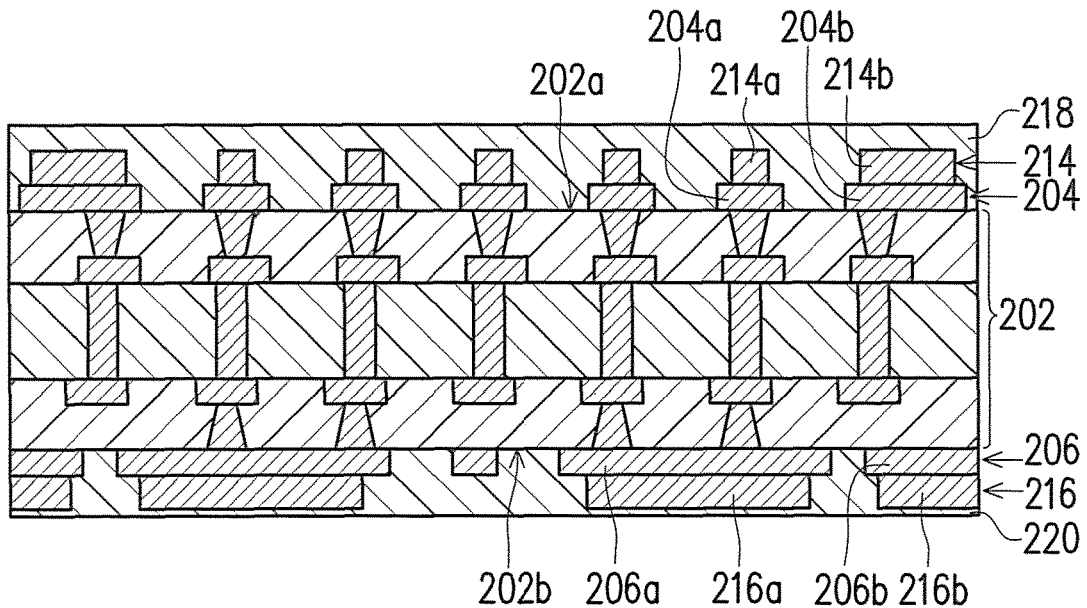

Referring to FIG. 9E, a first dielectric layer is formed and the first surface 202a, the first patterned inner conductive layer 204 and the first patterned outer conductive layer 214 which are exposed are covered. In addition, a second dielectric layer 220 is formed and the second surface 202b, the second patterned inner conductive layer 206 and the second patterned outer conductive layer 216 which are exposed are covered.

Figure 9F:
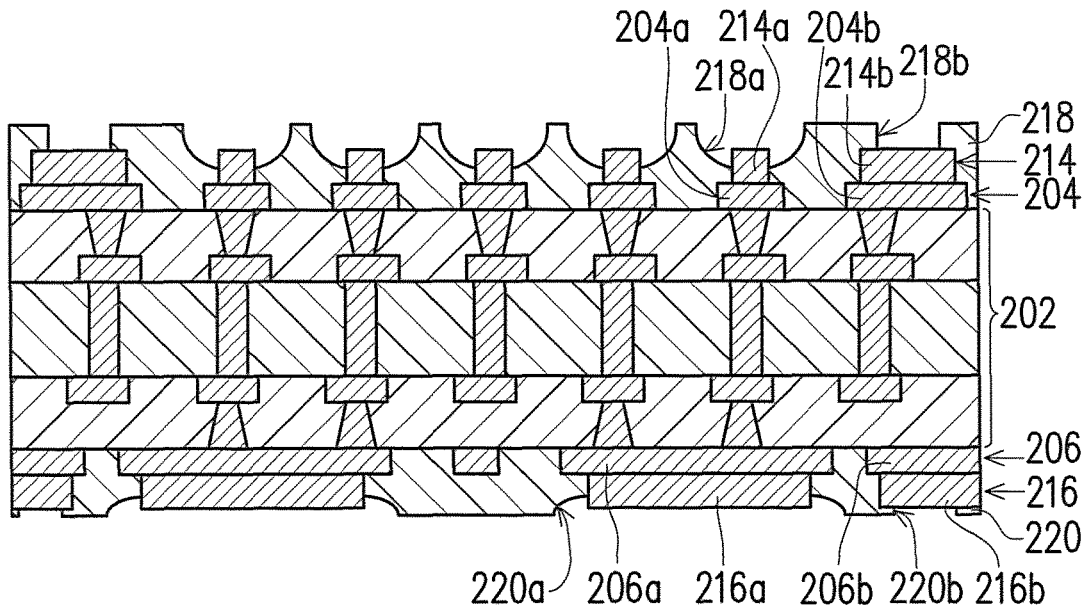

Referring to FIG. 9F, a portion of the first dielectric layer 218 can be removed through a laser to form the first concaves 218a and the first dielectric openings 218b, wherein the first concaves 218a expose the top and the side of the corresponding first conductive pillars 214a, and the first dielectric openings 218b expose the first outer conductive pattern 214b. Similar to the first concaves 142 of FIG. 1B and FIG. 2, referring in top view, the adjacent first concaves 218a are independent and are not overlapped one another. Besides, in the present embodiment, the first concaves 218a expose a portion of the side of the corresponding first conductive pillar 214a. In other embodiments, the exposed area of the side of the first conductive pillar 214a can be changed as required. In addition, since the region area of the first outer conductive pattern 214b is comparatively greater than the region area of the first conductive pillar 214a, during the laser ablation process, the first dielectric layer 218 located at the side of the first conductive pillar 214a is ablated, but the first dielectric layer 218 located at the side of the first outer conductive pattern 214b is not ablated. Thus, only the top of the first outer conductive pattern 214b is exposed, and the exposed area of the top of the first outer conductive pattern 214b can be changed as required.

Referring to FIG. 9F, a portion of the second dielectric layer 220 can be removed through a laser to form the second concaves 220a and the second dielectric openings 220b, wherein the second concaves 220a expose the top and the side of the corresponding second conductive pillars 216a, and the second dielectric openings 220b expose the second outer conductive pattern 216b. In another embodiment, the second concave 220a exposes the corresponding second pad 206a so as to achieve a larger soldering area (not shown). Besides, in the present embodiment, the second concaves 220a expose a portion of the side of the corresponding second conductive pillar 216a. In other embodiments, the exposed area of the side of the second conductive pillar 216a can be changed as required. In addition, since the region area of the second outer conductive pattern 216b is comparatively greater than the region area of the second conductive pillar 216a, during the laser ablation process, the second dielectric layer 220 located at the side of the second conductive pillar 216a is ablated, but the second dielectric layer 220 located at the side of the second outer conductive pattern 216b is not ablated. Thus, only the top of the second outer conductive pattern 216b is exposed, and the exposed area of the top of the second outer conductive pattern 216b can be changed as required.

It has to be noted that during removing a portion of the first dielectric layer 218 and a portion of the second dielectric layer 220 by using a laser ablation process, the depth of the first concaves 218a and the second concaves 220a can be controlled by the control of energy intensity and the emitting count of the laser.

Figure 9G:
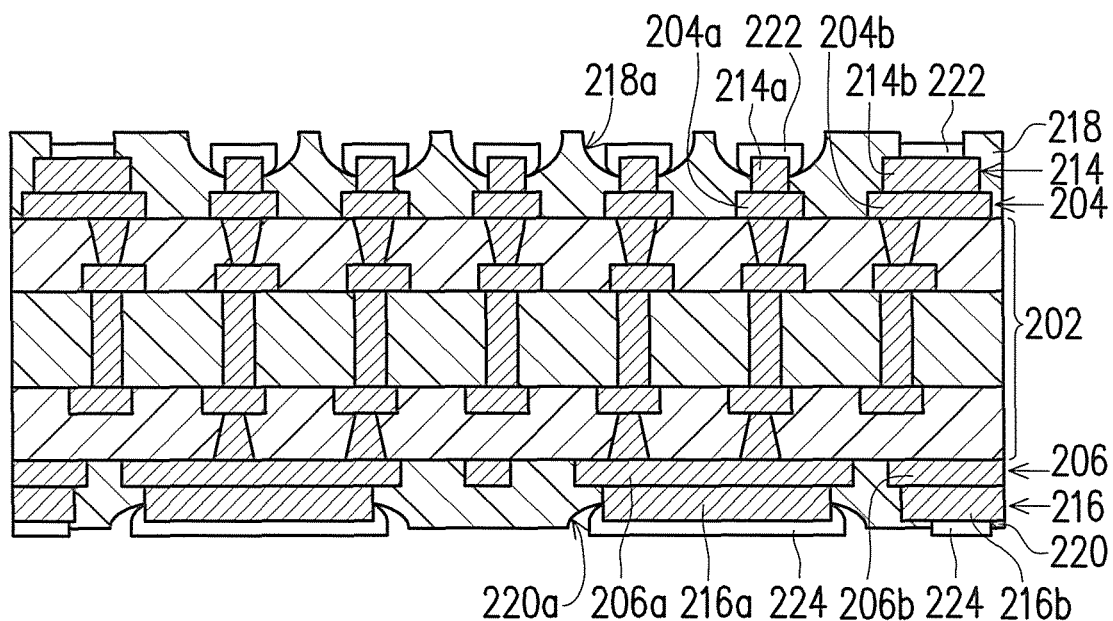

Referring to FIG. 9G, after a portion of the first dielectric layer 218 and a portion of the second dielectric layer 220 are removed, a plurality of first protective layers 222 are formed on the first conductive pillars 214a and the first outer conductive pattern 214b, and a plurality of second protective layers 224 are formed on the second conductive pillars 216a and the second outer conductive pattern 216b. In another embodiment, if the second concaves 220a expose the corresponding second pads 206a, then the second protective layers 224 can be formed on the corresponding second pads 206a (not shown).

Figure 10A:
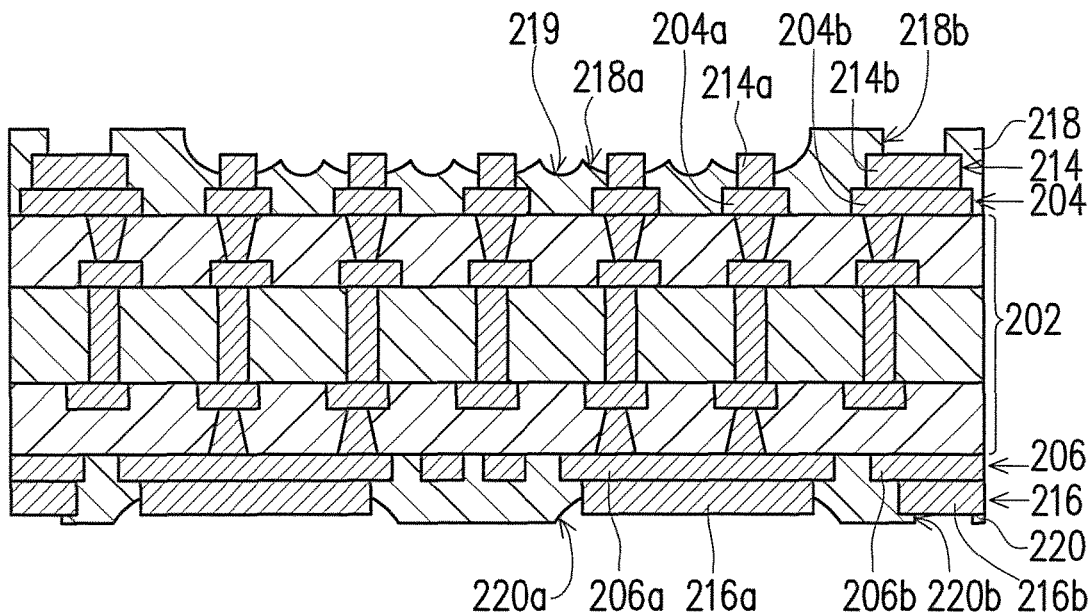
FIG. 10A through FIG. 10B are cross-sectional views illustrating a process of fabricating a circuit substrate according to another embodiment of the present invention.
Figure 10B:
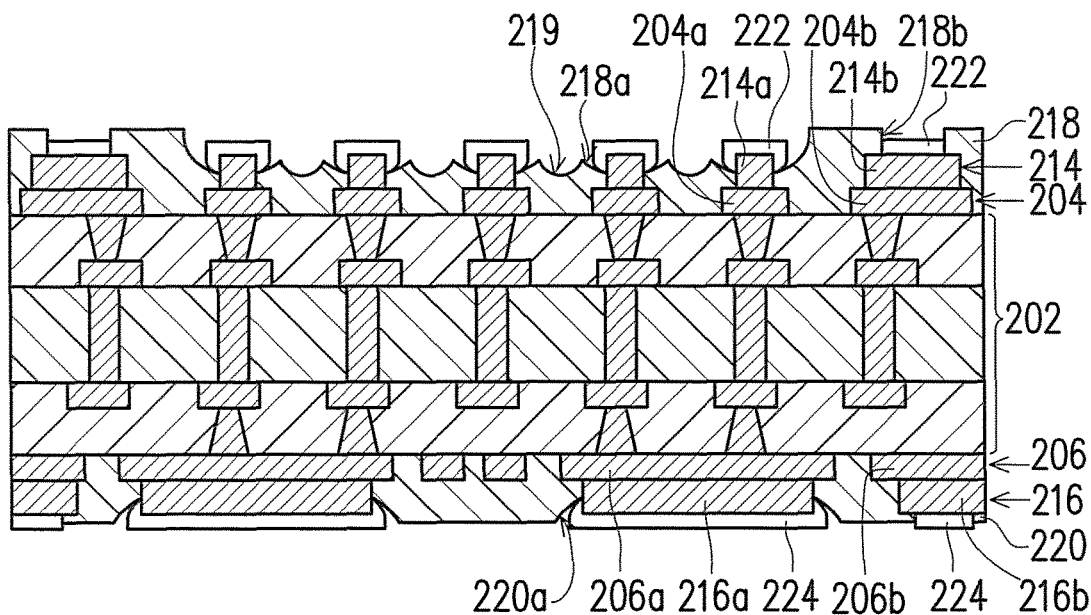

FIG. 10A through FIG. 10B are cross-sectional views illustrating a process of fabricating a circuit substrate according to another embodiment of the present invention. Referring to FIG. 10A, after the step of FIG. 9E, a portion of the first dielectric layer 218 and a portion of the second dielectric layer 220 are removed. The outer diameter of each of the first concaves 218a formed by the first dielectric layer 218 of FIG. 10A is larger. Thus, the adjacent first concaves 218a overlap one another and a sub-concave 219 is formed therebetween. Even some of the sub-concaves 219 are formed by the overlapping of three first concaves 218a (as illustrated in the description related to FIG. 7). Afterwards, referring to FIG. 10B, similar to the step of FIG. 9G, first protective layers 222 and second protective layers 224 are formed.

Figure 11A:
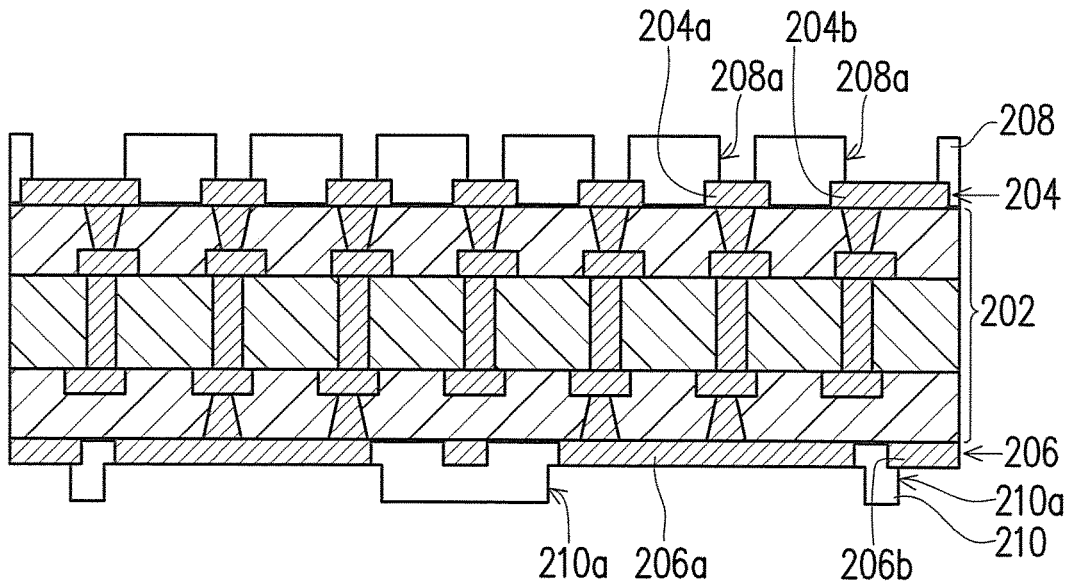
FIG. 11A through FIG. 11C are cross-sectional views illustrating a process of fabricating a circuit substrate according to another embodiment of the present invention.
Figure 11B:
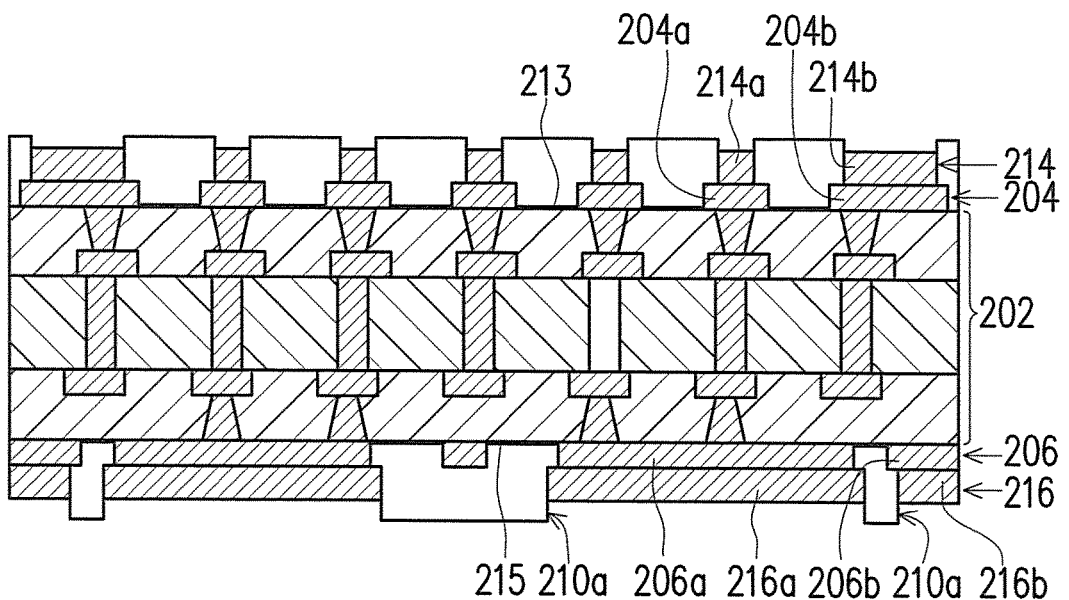
Figure 11C:
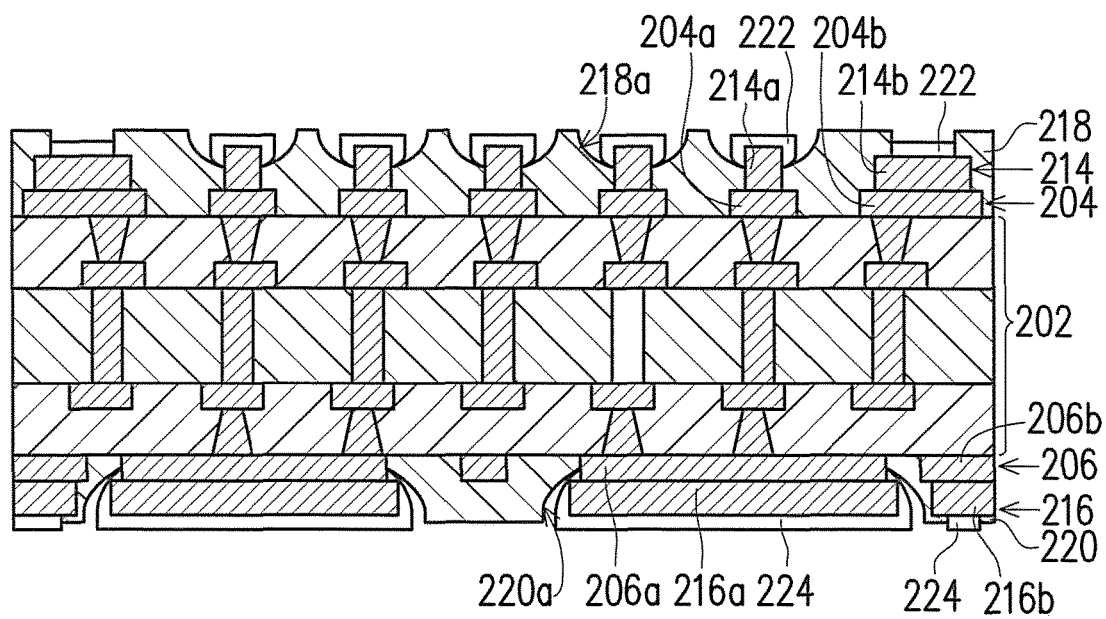

FIG. 11A through FIG. 11C are cross-sectional views illustrating a process of fabricating a circuit substrate according to another embodiment of the present invention. Referring to FIG. 11A, after the step of FIG. 9A, the outer diameter of the second photoresist opening 210a of the second patterned photoresist layer 210 is greater than the outer diameter of the second pad 206a. Next, referring to FIG. 11B, the first patterned outer conductive layer 216 having the second conductive pillars 216a and the second outer conductive pattern 216b is formed. Through the outer diameter of the second photoresist opening 210a being greater than the outer diameter of the second pad 206a, so the outer diameter of the second conductive pillar 216a is greater than the outer diameter of the second pad 206a. After that the steps similar to the steps of FIG. 9D and FIG. 9F is performed. Finally, referring to FIG. 11C, similar to the step of FIG. 9G, first protective layers 222 and second protective layers 224 are also formed.

The process for fabricating a circuit substrate of the embodiment of FIG. 9A to FIG. 9G can fabricate a circuit substrate similar to that of the embodiment of FIG. 1A. The process for fabricating a circuit substrate of the embodiment of FIG. 10A to FIG. 10B can fabricate a circuit substrate similar to that of the embodiment of FIG. 6. The process for fabricating a circuit substrate of the embodiment of FIG. 11A to FIG. 11C can fabricate a circuit substrate similar to that of the embodiment of FIG. 5. The combination of the process for fabricating a circuit substrate of the embodiment of FIG. 10A to FIG. 10B and that of FIG. 11A to FIG. 11C can fabricate a circuit substrate similar to that of the embodiment of FIG. 8A or FIG. 8B.

Furthermore, in the abovementioned process for fabricating a circuit substrate, only the upper structure or the lower structure of the stacked circuit structure can be fabricated, and fabricating both upper and lower structures of the stacked circuit structure at the same time is not needed.

In light of the foregoing, in the present invention, since in order to provide a larger three dimensional bonding area out of the smaller two dimensional pad area, the top and side of the conductive pillars located on the pads are exposed through the concaves of the dielectric layers, this facilitates the increase of the gaps between the pads and the increase of layout density. Furthermore, the outer conductive pattern can be fabricated together with the fabricating of conductive pillars and can be thermally connected to the heat dissipating element (such as the heat spreader or the heat slug), and can serve as a reference plane (such as the ground plane or the power plane).

Although the present invention has been described with reference to the above embodiments, it will be apparent to one of ordinary skill in the art that modifications to the described embodiments may be made without departing from the spirit of the invention. Accordingly, the scope of the invention will be defined by the attached claims and not by the above detailed descriptions.

What is claimed is:

1. A circuit substrate, comprising:
   a stacked circuit structure having a first surface and a second surface opposite to the first surface;
   a first patterned inner conductive layer disposed on the first surface and having a plurality of first pads;
   a first patterned outer conductive layer disposed on the first patterned inner conductive layer and having a plurality of first conductive pillars, wherein each of the first conductive pillars is located on the corresponding first pad;
   a first dielectric layer covering the first surface, the first patterned inner conductive layer and the first patterned outer conductive layer and having a plurality of first concaves, wherein each of the first concaves exposes a top and a side of the corresponding first conductive pillar, and the top and the side of the first conductive pillar are exposed for directly soldering a chip;
   a second patterned inner conductive layer disposed on the second surface and having a plurality of second pads;
   a second patterned outer conductive layer disposed on the second patterned inner conductive layer and having a plurality of second conductive pillars, wherein each of the second conductive pillars is located on the corresponding second pad; and
   a second dielectric layer covering the second surface, the second patterned inner conductive layer and the second patterned outer conductive layer and having a plurality of second concaves, wherein each of the second concaves exposes a top and a side of the corresponding second conductive pillar;
   wherein an outer diameter of each of the second conductive pillars is smaller than an outer diameter of the corresponding second pad, and the corresponding second concave exposes a portion of the corresponding second pad.

2. The circuit substrate as claimed in claim 1, wherein a height of the first dielectric layer relative to the first surface is greater than a height of each of the first conductive pillars relative to the first surface.

3. The circuit substrate as claimed in claim 1, wherein the adjacent first concaves overlap one another and a sub-concave is formed therebetween.

4. The circuit substrate as claimed in claim 1, wherein a height of the second dielectric layer relative to the second surface is greater than a height of each of the second conductive pillars relative to the second surface.

5. The circuit substrate as claimed in claim 1, wherein each of the second concaves exposes a portion of a side of the corresponding second pad.

6. A semiconductor package, comprising:
a circuit substrate, comprising:
a stacked circuit structure having a first surface and a second surface opposite to the first surface;
a first patterned inner conductive layer disposed on the first surface and having a plurality of first pads;
a first patterned outer conductive layer disposed on the first patterned inner conductive layer and having a plurality of first conductive pillars, wherein each of the first conductive pillars is located on the corresponding first pad;
a first dielectric layer covering the first surface, the first patterned inner conductive layer and the first patterned outer conductive layer and having a plurality of first concaves, wherein each of the first concaves exposes a top and a side of the corresponding first conductive pillar;
a second patterned inner conductive layer disposed on the second surface and having a plurality of second pads;
a second patterned outer conductive layer disposed on the second patterned inner conductive layer and having a plurality of second conductive pillars, wherein each of the second conductive pillars is located on the corresponding second pad; and
a second dielectric layer covering the second surface, the second patterned inner conductive layer and the second patterned outer conductive layer and having a plurality of second concaves, wherein each of the second concaves exposes a top and a side of the corresponding second conductive pillar;
wherein an outer diameter of each of the second conductive pillars is smaller than an outer diameter of the corresponding second pad, and the corresponding second concave exposes a portion of the corresponding second pad; and
a chip soldered to the first conductive pillars.

7. The semiconductor package as claimed in claim 6, wherein a height of the first dielectric layer relative to the first surface is greater than a height of each of the first conductive pillars relative to the first surface.

8. The semiconductor package as claimed in claim 6, further comprising:
a heat spreader, the first patterned inner conductive layer having at least one first inner conductive pattern, the first patterned outer conductive layer having at least one first outer conductive pattern, the first outer conductive pattern being located on the first inner conductive pattern, the first dielectric layer exposing the first outer conductive pattern, wherein the first inner conductive pattern and the first outer conductive pattern serve as a heat dissipating path, and the heat spreader is soldered to the first outer conductive pattern.

9. The semiconductor package as claimed in claim 6, wherein the adjacent first concaves overlap one another and a sub-concave is formed therebetween.

10. The semiconductor package as claimed in claim 6, wherein a height of the second dielectric layer relative to the second surface is greater than a height of each of the second conductive pillars relative to the second surface.

11. The semiconductor package as claimed in claim 6, further comprising:
a heat slug, the second patterned inner conductive layer having at least one second inner conductive pattern, the second patterned outer conductive layer having at least one second outer conductive pattern, the second outer conductive pattern being located on the second inner conductive pattern, the second dielectric layer exposing the second outer conductive pattern, wherein the second inner conductive pattern and the second outer conductive pattern serve as a heat dissipating path, and the heat slug is soldered to the second outer conductive pattern.

* * * * *